United States Patent [19]
Lin et al.

[11] Patent Number: 6,165,693
[45] Date of Patent: Dec. 26, 2000

[54] METHOD OF DESIGNING AN ASSIST FEATURE

[75] Inventors: Chin-Lung Lin, Kaohsiung; Yao-Ching Ku, Hsinchu Hsien, both of Taiwan

[73] Assignee: United Microelectronics Corp., Hsinchu, Taiwan

[21] Appl. No.: 09/135,434

[22] Filed: Aug. 17, 1998

[30] Foreign Application Priority Data

Jun. 11, 1998 [TW] Taiwan ................................. 87109287

[51] Int. Cl.⁷ ...................................................... G03C 5/00
[52] U.S. Cl. ............................................................ 430/311
[58] Field of Search ................................. 430/5, 296, 311

[56] References Cited

U.S. PATENT DOCUMENTS 5,636,002   6/1997   Garofalo ........................................ 430/5
5,821,014   10/1998  Chen et al. .................................... 430/5
5,847,421   12/1998  Yamaguchi .................................. 257/207

*Primary Examiner*—S. Rosasco
*Attorney, Agent, or Firm*—Thomas, Kayden, Horstemeyer & Risley

[57] ABSTRACT

For a dense-line mask pattern, if the ratio of space width to line width is larger than 2.0 and the size of the line width is less than the exposure wave length, or for an iso-line mask pattern, if the size of the line width is less than the exposure wave length, assist features should be added and OAI should be used to increase the process window. For a dense-line mask pattern, if the ratio of space width to line width is smaller than 2.0, or for an iso-line mask pattern, if the size of the line width is larger than the exposure wavelength, no assist feature should be added.

16 Claims, 3 Drawing Sheets ical proximity correction pattern according to a preferred embodiment of the invention.
METHOD OF DESIGNING AN ASSIST FEATURE

CROSS-REFERENCE TO RELATED APPLICATION

This application claims the priority benefit of Taiwan application serial no. 87109287, filed Jun. 11, 1998, pending the full disclosure of which is incorporated herein by reference.

BACKGROUND OF THE INVENTION

1. Field of Invention

The present invention relates to a method of designing an assist feature. More particularly, the present invention relates to a method of designing an assist feature, incorporated with off-axis illumination (OAI) in order to increase the process window of deep submicron.

2. Description of Related Art

Photolithography plays an important role in the semiconductor process. For each semiconductor device, patterns of all films and doping regions are decided by this step. Therefore, the numbers of photolithography required for a process, which is the needed mask number, decide the difficulty of the process.

The photolithography technique is complicate but the principle behind it is fairy simple. For example, photosensitive material is first coated on the wafer. Then, light source is projected to the photosensitive material through the mask, which is mainly composed of glass. The light beam through the mask has the same pattern as the mask so that the mask pattern can be transferred to the photosensitive material on the wafer. The photosensitive material can be, for example, photoresist. Then, after exposure or/and development, equal or complementary pattern on the mask can be transferred to the photosensitive material. If the photosensitive material is positive photoresist, it will obtain a pattern the same as the mask. On the other hand, if the photosensitive material is negative photoresist, it will obtain a complementary pattern as the mask.

As negative photoresist is used, after exposure and during the step of development, developer will penetrate into the space between the molecular in the negative photoresist. Consequently, the photoresist swells and the differentiation between the after-development pattern of negative photoresist and the mask pattern increases. It is therefore not suitable for process down to 3 μm to use negative photoresist. As a result, positive photoresist is more widely used to the sub-micron semiconductor technique presently.

The exposure technique used for transferring patterns from the mask to the photoresist has three main types: contact type, proximity type and projection type. For the semiconductor technique of deep sub-micron, the degree of precision of the exposure technique is highly limited to photo-resolution. The limitation of photo-resolution may cause error or even failure of pattern transferring. Proximity exposure technique is taken as an example. FIG. 1 illustrates the original mask pattern. After the step of exposure, the pattern of photoresist is substantially the same as the pattern shown in FIG. 2. Comparing the original mask pattern in FIG. 1 and the transferred pattern in FIG. 2, the difference between these two patterns is obvious. For example, the four sides 10, 11, 12, 13 of the original mask pattern shrinks to be sides 20, 21, 22, 23, as shown in FIG. 2, after the pattern is transferred. Due to the limitation of the resolution, the shrinking level of the narrower sides 10, 12 is larger than that of the wider sides 11, 13. Further, the configurations of the corners change greatly to become rounded corners. As shown in FIG. 1 and FIG. 2, the right-angled corner 14 becomes a rounded corner 24.

The problems coming after the error due to pattern transfer is serious. For example, during the back-end processes, the error may cause over-etching and improper coupling of interconnection.

Consequently, during the process of proximity pattern transfer, the original pattern is usually processed through optical proximity correction to form a pattern for transferring.

For example, if the original pattern is as shown in FIG. 3, in order to obtain better pattern transfer, assist features are generally added to form an optical proximity pattern as shown in FIG. 4. The assist features herein include assist features 40, 41, 42, 43, 44, 45, 46, 47. This optical proximity correction pattern provides a substantially similar transfer pattern of the original pattern after it is transferred. However, the sizes of the assist features are fairy small; as a result, they are hard to fabricate and suffer from the difficulties in mask inspection.

SUMMARY OF THE INVENTION

It is therefore an object of the invention to provide a method of designing an assist feature, incorporated with off-axis illumination (OAI) in order to increase the process window of deep submicron. For example, as selecting the assist features for the original pattern, the factors of exposure wavelength, line width and space width of the pattern should be concerned. Appropriate assist features are then added to form a mask pattern, which is an effective mask pattern for pattern transfer and increases the process window.

To achieve the above-mentioned objects, a design method is disclosed. For a dense-line mask pattern, if the ratio of space width to line width is larger than 2.0 and the size of the line width is less than the exposure wave length, or for an isolated mask pattern, if the size of the line width is less than the exposure wave length, assist features should be added and OAI should be used to increase the process window. For a dense-line mask pattern, if the ratio of space width to line width is smaller than 2.0, or for an isolated mask pattern, if the size of the line width is larger than the exposure wavelength, no assist feature should be added.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE INVENTION

The precision of the transfer pattern influences greatly the development of the semiconductor subsequent processes. Therefore, during the pattern transferring, the original pattern is first processed through optical correction and then the pattern is used as a transfer pattern. Also, as concerning the precision of the pattern, the influences of the optical correction pattern to the mask process window, the complex of the process and the ratio of the line width and space width of the pattern should be taken into account.

Figure 5:
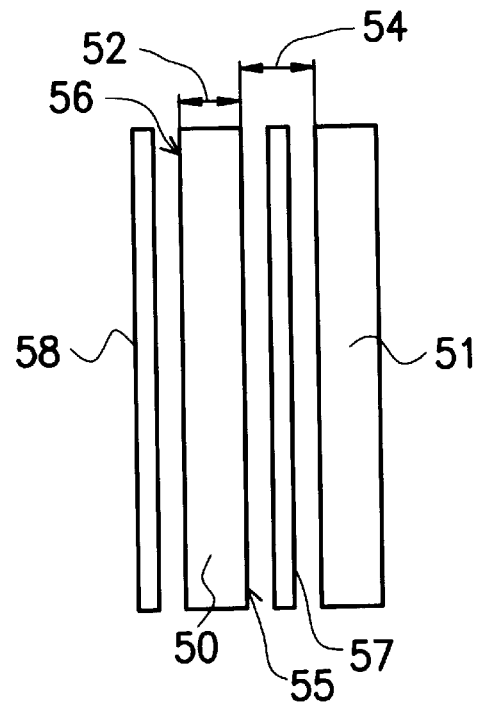
FIG. 5 illustrates a method of designing a dense-line mask pattern.

For the deep sub-micron semiconductor process, for example, less than 0.3 µm, the using of the assist pattern should be selected due to the increase of difficulties in mask fabrication and inspection. The dense-line mask patterns 50, 51 as shown in FIG. 5 are taken as examples. If the line width 52 of the pattern has a size less than the exposure wavelength (the general exposure wavelength is about 4000 Å, equal to 0.4 µm), OAI is always utilized to increase the process window of the dense-line mask pattern. However, for a dense-line mask pattern with a spacer width 54 to line width 52 ratio of larger than 2.0, the transfer result is not ideal. Assist patterns 57, 58 should be added to the corresponding sides 55, 56 of the pattern 50 in order to increase the process window. If the spacer width 54 to line width 52 ratio of the dense-line mask pattern is less than 2.0, assist features are not needed to be added to the corresponding sides 55, 56 of the line width.

Figure 6:
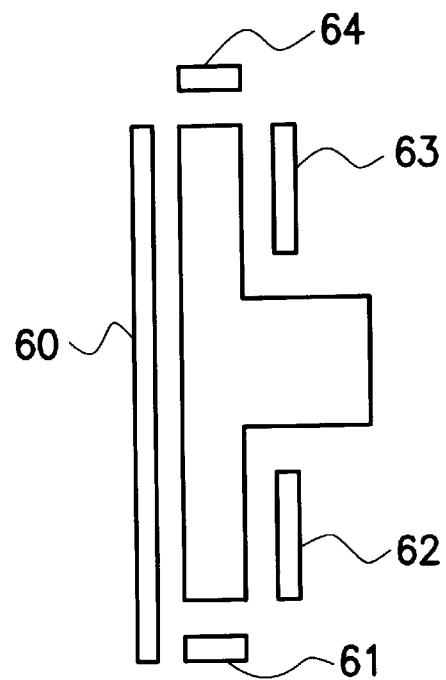
FIG. 6 illustrates a method of designing an optical proximity correction pattern according to a preferred embodiment of the invention.

The method of designing isolated mask pattern is similar but the only criterion is if the pattern line width is smaller than the exposure line width but without the consideration of the space width. For example, if the line width is smaller than the exposure wavelength, assist patterns should be added to the corresponding sides of line width. FIG. 6 shows the optical proximity correction pattern of the original pattern shown in FIG. 3 according to a preferred embodiment of the invention. It is therefore summarized as followed:

1. For a dense-line mask pattern, if the ratio of space width to line width is larger than 2.0 and the size of the line width is less than the exposure wave length, or for an isolated mask pattern, if the size of the line width is less than the exposure wavelength, assist features should be added and OAI should be used to increase the process window.
2. For a dense-line mask pattern, if the ratio of space width to line width is smaller than 2.0, or for an isolated mask pattern, if the size of the line width is larger than the exposure wavelength, no assist feature should be added.

Figure 1:
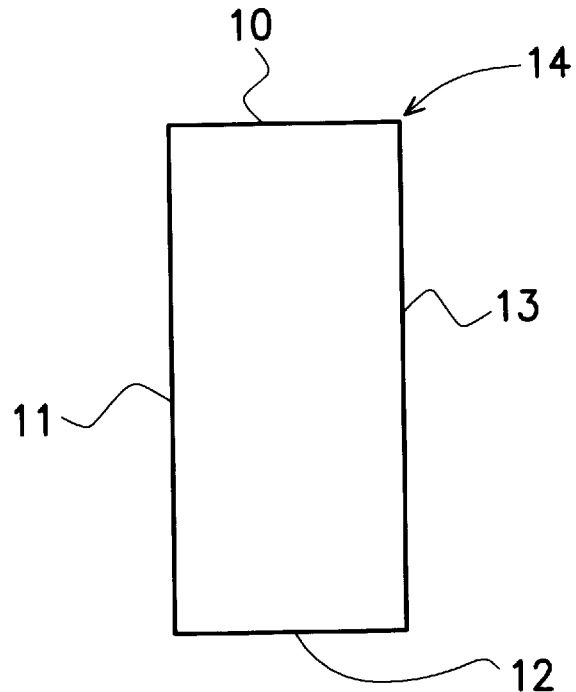
FIG. 1 illustrates a conventional original mask pattern.
Figure 2:
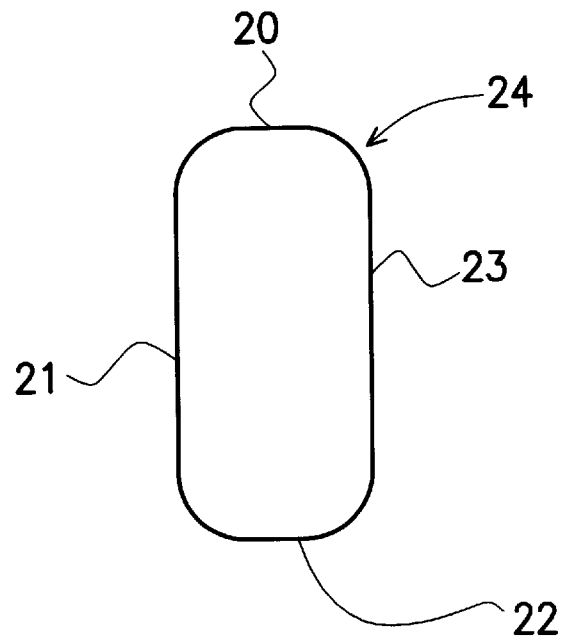
FIG. 2 illustrates a transfer pattern according to FIG. 1.
Figure 3:
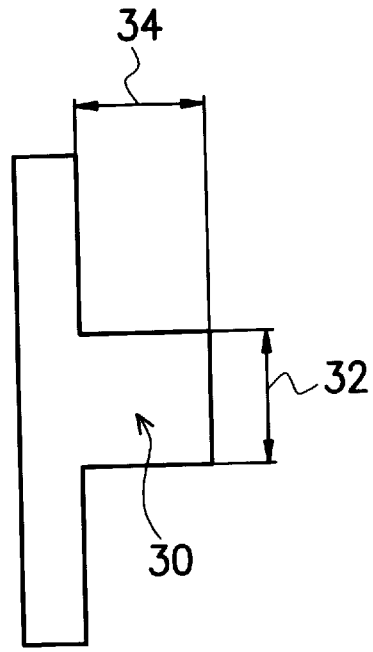
FIG. 3 illustrates another conventional original mask pattern.
Figure 4:
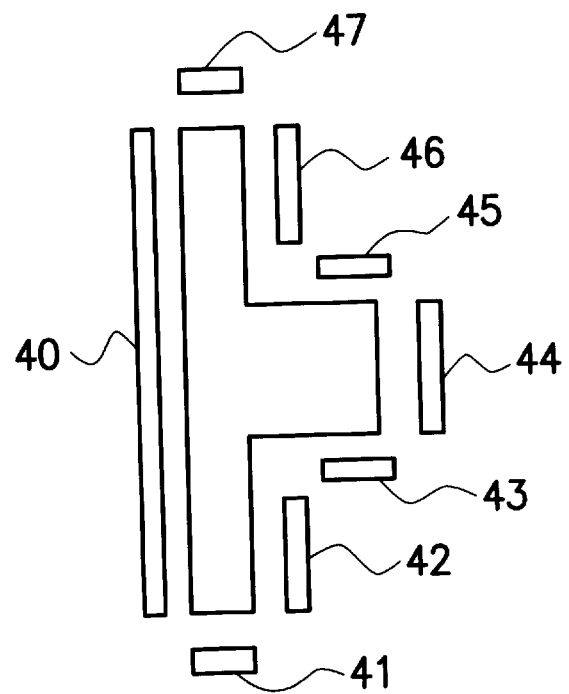
FIG. 4 illustrates an optical proximity correction pattern according to FIG. 3.

In FIG. 3, line widths 32, 34 of the bugler 30 both have a size larger than the exposure wavelength. Compared the pattern design according to the present invention in FIG. 6 with the conventional optical proximity correction pattern in FIG. 4, it is shown that the pattern of the present invention includes only assist features 60, 61, 62, 63, 64. Without the assist features 43, 44, 45, the mask pattern of the present invention reaches the requirement of semiconductor process window and further reduces the difficulties in mask fabrication and inspection, especially for the process of less than 0.3 µm.

Therefore, one of the characters of the invention is the use of OAI to increase process window for a mask pattern having a line width less than exposure mask pattern.

Another character of the invention is that if the space width to line width ratio is larger than 2.0 and the line width is smaller than exposure wavelength, for the line mask pattern, or if the linewidth is smaller than exposure wavelength, for an isolated mask pattern, assist features should be added.

An other character of the invention is that if the space width to line width ratio is smaller than 2.0, for the dense-line mask pattern, or if the linewidth is larger than exposure wavelength, for an iso-line mask pattern, no assist feature should be added to reduce the difficulties in mask fabrication and inspection.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of designing assist features, which is used to correct an original pattern and to form an optical correction pattern and is incorporated with off-axis illumination, wherein the original pattern comprises a plurality of sides and each of the sides is corresponded to each of a plurality of line widths, wherein the line widths comprise a plurality of first line widths larger than an exposure wavelength and a plurality of second line widths smaller than the exposure wavelength, wherein the method comprises:

adding assist features to the sides corresponded to the second line widths, wherein the original pattern is an isolated line mask pattern.

2. A method of claim 1, wherein the method is applied in a deep submicron semiconductor process.

3. A method of claim 2, wherein the method is applied in less than 0.3 µm semiconductor process.

4. A method of claim 1, wherein off-axis illumination is used to expose the optical correction pattern.

5. A method of claim 1, wherein the optical correction pattern is an optical proximal correction pattern.

6. A method of designing assist features, which is used to correct an original pattern and to form an optical correction pattern and is incorporated with off-axis illumination, wherein the original pattern comprises a plurality of mask patterns, and between every two mask patterns, there is a space width and wherein each of the mask patterns has a line width and the line width has a corresponding side, whereas the line width is less than exposure wavelength, the method comprising:

if the spacer width and the line width ratio is larger than 2.0, adding assist features to the side corresponding to the line width; and if the spacer width and the line width ratio is smaller than 2.0, not adding assist features to the side corresponding to the line width.

7. A method of claim 6, wherein the method is applied in a deep submicron semiconductor process.

8. A method of claim 7, wherein the method is applied in less than 0.3 µm semiconductor process.

9. A method of claim 6, wherein off-axis illumination is used to expose the optical correction pattern.

10. A method of claim 6, wherein the optical correction pattern is an optical proximal correction pattern.

11. A method of designing assist features, applied in a deep sub-micron semiconductor process, to correct an original pattern to form an optical correction pattern and is incorporated with off-axis illumination, wherein the original pattern comprises at least a plurality of sides, each of the sides is corresponded to each of a plurality of line widths, wherein the line widths comprise a plurality of first line widths larger than exposure wavelength and a plurality of second line widths smaller than the exposure wavelength, the method comprising:

adding assist features to the sides corresponding to the second line widths, wherein the original pattern is an isolated line mask pattern.

12. A method of claim 11, wherein the optical correction pattern is exposed by off-axis illumination.

13. A method of claim 11, wherein the optical correction pattern is an optical proximal correction pattern.

14. A method of designing assist features, applied in a deep sub-micron semiconductor process, which is used to correct an original pattern and to form an optical correction pattern and is incorporated with off-axis illumination, wherein the original pattern comprises a plurality of mask patterns, and between every two mask patterns, there is a space width and wherein each of the mask patterns has a line width and the line width has a corresponding side, whereas the line width is less than exposure wavelength, the method comprising:

if the spacer width and the line width ratio is larger than 2.0, adding assist features to the side corresponding to the line width; and if the spacer width and the line width ratio is smaller than 2.0, not adding assist features to the side corresponding to the line width.

15. A method of claim 14, wherein off-axis illumination is used to expose the optical correction pattern.

16. A method of claim 14, wherein the optical correction pattern is an optical proximal correction pattern.

* * * * *